United States Patent
Chang et al.

(10) Patent No.: US 9,749,171 B2
(45) Date of Patent: Aug. 29, 2017

(54) COMMUNICATION RECEIVING END AND AUTO GAIN CONTROL METHOD THEREOF

(71) Applicant: Realtek Semiconductor Corporation, Hsinchu (TW)

(72) Inventors: Chung-Yao Chang, Hsinchu County (TW); Chuan-Hu Lin, Changhua County (TW)

(73) Assignee: REALTEK SEMICONDUCTOR COTPORATION, Hsinchu (TW)

( * ) Notice: Subject to any disclaimer, the term of this patent is extended or adjusted under 35 U.S.C. 154(b) by 0 days.

(21) Appl. No.: 15/283,900

(22) Filed: Oct. 3, 2016

(65) Prior Publication Data

US 2017/0111204 A1    Apr. 20, 2017

(30) Foreign Application Priority Data

Oct. 19, 2015    (TW) .............................. 104134152 A (51) Int. Cl.
| | |
|---|---|
| *H04L 27/34* | (2006.01) |
| *H04L 5/00* | (2006.01) |
| *H04J 11/00* | (2006.01) |
| *H04L 27/26* | (2006.01) |

(52) U.S. Cl.
CPC ........ *H04L 27/3411* (2013.01); *H04L 5/0048* (2013.01); *H04J 11/00* (2013.01); *H04L 27/2601* (2013.01)

(58) Field of Classification Search
CPC .......... H04B 1/06; H03G 3/00; H04L 5/0048; H04L 27/3411
See application file for complete search history.

(56) References Cited

U.S. PATENT DOCUMENTS

| | | | |
|---|---|---|---|
| 2004/0151264 A1* | 8/2004 | Montojo .............. | H03G 3/3036 375/345 |
| 2006/0014507 A1* | 1/2006 | Giancola ............... | H03M 1/185 455/232.1 |
| 2006/0176093 A1* | 8/2006 | Song .................... | H03G 3/3063 327/179 |
| 2007/0258548 A1 | 11/2007 | Sutton | |
| 2010/0303180 A1 | 12/2010 | Xiong | |
| 2012/0039405 A1* | 2/2012 | Zheng .................. | H04L 5/0048 375/260 |

(Continued)

*Primary Examiner* — Tuan Pham
(74) *Attorney, Agent, or Firm* — WPAT, P.C., Intellectual Property Attorneys; Anthony King (57) ABSTRACT

A communication receiving end for receiving an inputted signal includes a signal amplifier for adjusting the inputted signal according to a first predetermined gain or a second predetermined gain to generate a first adjusted signal; an analog-to-digital converter (ADC), coupled to the signal amplifier, for converting the first adjusted signal; and a control unit, coupled to the ADC, for determining whether the ADC is saturated or not according to an output of the ADC. The first predetermined gain is associated with a first inputted signal power processed by the communication receiving end and a quantization noise of the ADC. The second predetermined gain is associated with a second inputted signal power processed by the communication receiving end and a full scale level of the ADC. The first inputted signal power is smaller than the second inputted signal power.

19 Claims, 8 Drawing Sheets

(56) References Cited

U.S. PATENT DOCUMENTS

2013/0322269 A1* 12/2013 Zhang .................. H04W 52/52
                                                    370/252
2015/0215141 A1*  7/2015 Aznar .................. H03G 3/3078
                                                    375/345

* cited by examiner

COMMUNICATION RECEIVING END AND AUTO GAIN CONTROL METHOD THEREOF

BACKGROUND OF THE INVENTION

1. Field of the Invention

The present invention relates to a communication system, especially to a communication receiving end of a wireless communication system and an auto gain control method thereof.

2. Description of Related Art

Figure 1:
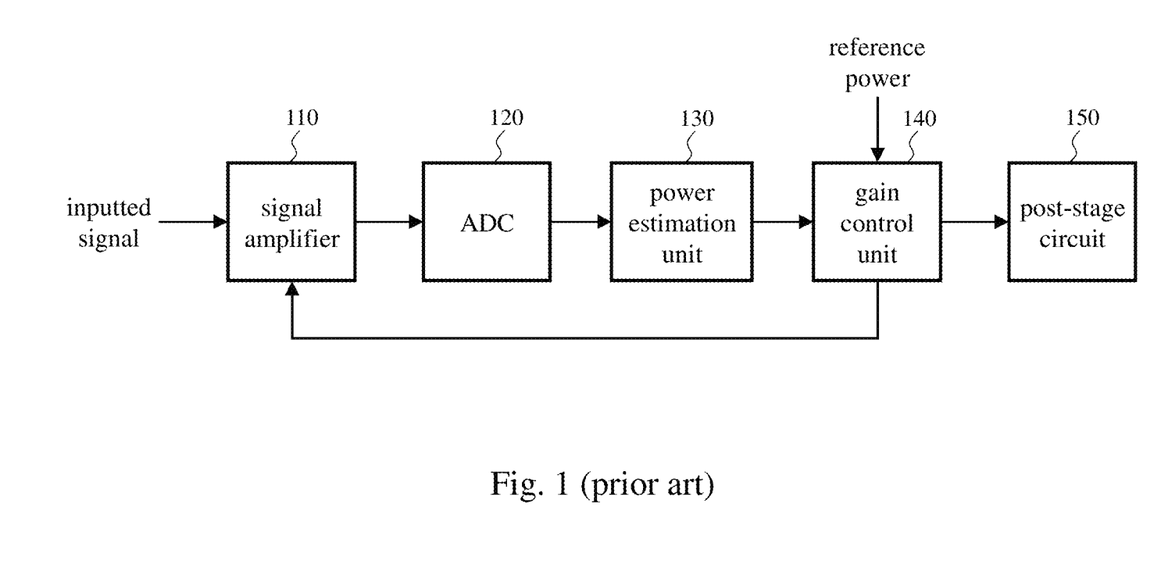
FIG. 1 illustrates a block diagram of a conventional signal receiving end.

FIG. 1 illustrates a block diagram of a conventional signal receiving end. Because the signal power received at the receiving end is unknown, the receiving end has to rapidly complete the adjustment of the gain of the signal amplifier 110 so as not to interfere with the reception of the signal. The success rate of the cell search is subject to the speed at which the gain control unit 140 adjusts the gain. Only when the cell search is complete, the post-stage circuit 150 then processes the inputted signal that is already converted to a digital format. In a conventional gain adjusting process, the power estimation unit 130 calculates the power of the inputted signal, and then the gain control unit 140 compares the obtained signal power with a reference power to obtain a gain difference, which is subsequently fed back to the signal amplifier 110. When the analog-to-digital converter (ADC) 120 becomes saturated (i.e., the gain of the signal amplifier 110 is too large), and no other information is available to obtain an appropriate gain, a converging process by a progressively decreasing approach is employed to obtain the appropriate gain—this mechanism is known as a close-loop control mechanism. However, in a time-division duplexing long-term evolution (TDD-LTE) system, the configurations of uplink (UL) and downlink (DL) are unknown before synchronization. The powers of the UL signal and the DL signal differ greatly, in a way that the signal passing the signal amplifier 110 may saturate the ADC 120 if the gain of the signal amplifier 110 is too large or that the signal passing the signal amplifier 110 becomes so small that the converted signal generated by the ADC 120 fails to precisely reflect the content of the signal if the gain of the signal amplifier 110 is too small. Further, in a frequency-division duplexing long term evolution (FDD-LTE) system, different numbers of resource blocks (RBs) may be used in different DL subframes, causing the power of a received signal to vary from subframe to subframe. For the above reasons, the conventional gain controller that employs the close-loop control mechanism has to adjust the gain back and forth for several times before the gain converges; this slow and repetitive procedure decreases the success rate of the cell search dramatically.

SUMMARY OF THE INVENTION

In view of the issues of the prior art, an object of the present invention is to provide a communication receiving end and an auto gain control method thereof to increase the success rate of cell search, so as to make an improvement to the prior art.

One of the multiple objects of this invention is to provide a communication receiving end and an auto gain control method thereof to reduce the required time for the cell search.

The present invention discloses an auto gain control method of a communication receiving end. The communication receiving end comprising an ADC. The method comprises the steps of: adjusting an inputted signal according to a first predetermined gain; determining whether the adjusted inputted signal saturates the ADC; and adjusting the inputted signal according to a second predetermined gain. The first predetermined gain is associated with a first inputted signal power processed by the communication receiving end and a quantization noise of the ADC, the second predetermined gain is associated with a second inputted signal power processed by the communication receiving end and a full scale level of the ADC, and the first inputted signal power is smaller than the second inputted signal power.

The present invention also discloses a communication receiving end for receiving an inputted signal, comprising a first signal amplifier, a first ADC, and a control unit. The first signal amplifier adjusts the inputted signal according to a first predetermined gain or a second predetermined gain to generate a first adjusted signal. The first ADC performs analog-to-digital conversion on the first adjusted signal. The control unit determines whether the first ADC becomes saturated according to an output of the first ADC. The first predetermined gain is associated with a first inputted signal power processed by the communication receiving end and a quantization noise of the first ADC. The second predetermined gain is associated with a second inputted signal power processed by the communication receiving end and a full scale level of the first ADC. The first inputted signal power is smaller than the second inputted signal power.

The present invention further discloses a gain control method, applied to a gain control circuit of a communication receiving end. The gain control method comprises the steps of: in a first phase, utilizing a non-close-loop mechanism to perform gain control on the gain control circuit; and in a second phase subsequent to the first phase, utilizing a close-loop mechanism to perform gain control on the gain control circuit.

The communication receiving end and the auto gain control method of this invention utilize the reference signal appearing regularly in LTE transmission signals as a reference for the cell search, and determine the high and low gains used in the automatic gain control according to the allowed maximum and minimum inputted signal powers at user equipment (UE) defined in the specification of the LTE communication system and the characteristics of the ADC in use. As opposed to the prior art, this invention provides a more stable automatic gain control mechanism.

These and other objectives of the present invention no doubt become obvious to those of ordinary skill in the art after reading the following detailed description of the preferred embodiments with reference to the various figures and drawings.

DETAILED DESCRIPTION OF THE EMBODIMENTS

The following description is written by referring to terms of this technical field. If any term is defined in this specification, such term should be explained accordingly. In addition, the connection between objects or events in the below-described embodiments can be direct or indirect provided that these embodiments are practicable under such connection. Said "indirect" means that an intermediate object or a physical space exists between the objects, or an intermediate event or a time interval exists between the events.

From the time-domain perspective, each frame of the frame structure of a long-term evolution (LTE) communication system has a duration of 10 ms, and includes 10 subframes each having a duration of 1 ms. Each subframe is further divided into 2 slots. As the lengths of the cyclic prefixes (CP) defined by the system differ, each slot has different numbers of Orthogonal Frequency Division Multiplexing (OFDM) symbols. According to the specification of the LTE communication system, a slot contains 7 OFDM symbols for a normal CP whereas a slot contains 6 OFDM symbols for an extend CP.

The Orthogonal Frequency Division Multiple Access (OFDMA) technology is employed in the downlink of the LTE communication system, and there are several system bandwidths to choose from, such as 1.4 MHz, 3 MHz, 5 MHz, 10 MHz, 15 MHz and 20 MHz. The channel bandwidth is decided by local system operators. Taking 20 MHz for example, there are a total number of 2048 subcarriers, in which 1200 close to the central frequency are data-carrying subcarriers. Because 12 successive subcarriers form a resource block (RB), the bandwidth of 20 MHz is equivalent to the total width of 100 resource blocks. A base station realizes multiplexing by distributing the 100 resource blocks to different user equipments (UEs). The length of time of one resource block is a slot; i.e., one resource block comprises the data carried by 12 successive subcarriers in one slot.

In addition, in the FDD-LTE communication system, the uplink and the downlink transmit and receive signals at the same time at different radio frequencies. However, in the TDD-LTE communication system, as both the uplink and the downlink use the same radio frequencies, transmitting and receiving cannot be carried out at the same time; i.e., transmitting and receiving are carried out in different subframes. As a result, in the TDD-LTE communication system, the UE has to switch between uplink and downlink frequently (i.e., two successive subframes correspond respectively to uplink and downlink). Moreover, because the required transmitting powers for the uplink and the downlink are different, a more accurate control of the automatic gain in the LTE communication system becomes necessary to ensure correct signal transmitting and receiving.

Figure 2:
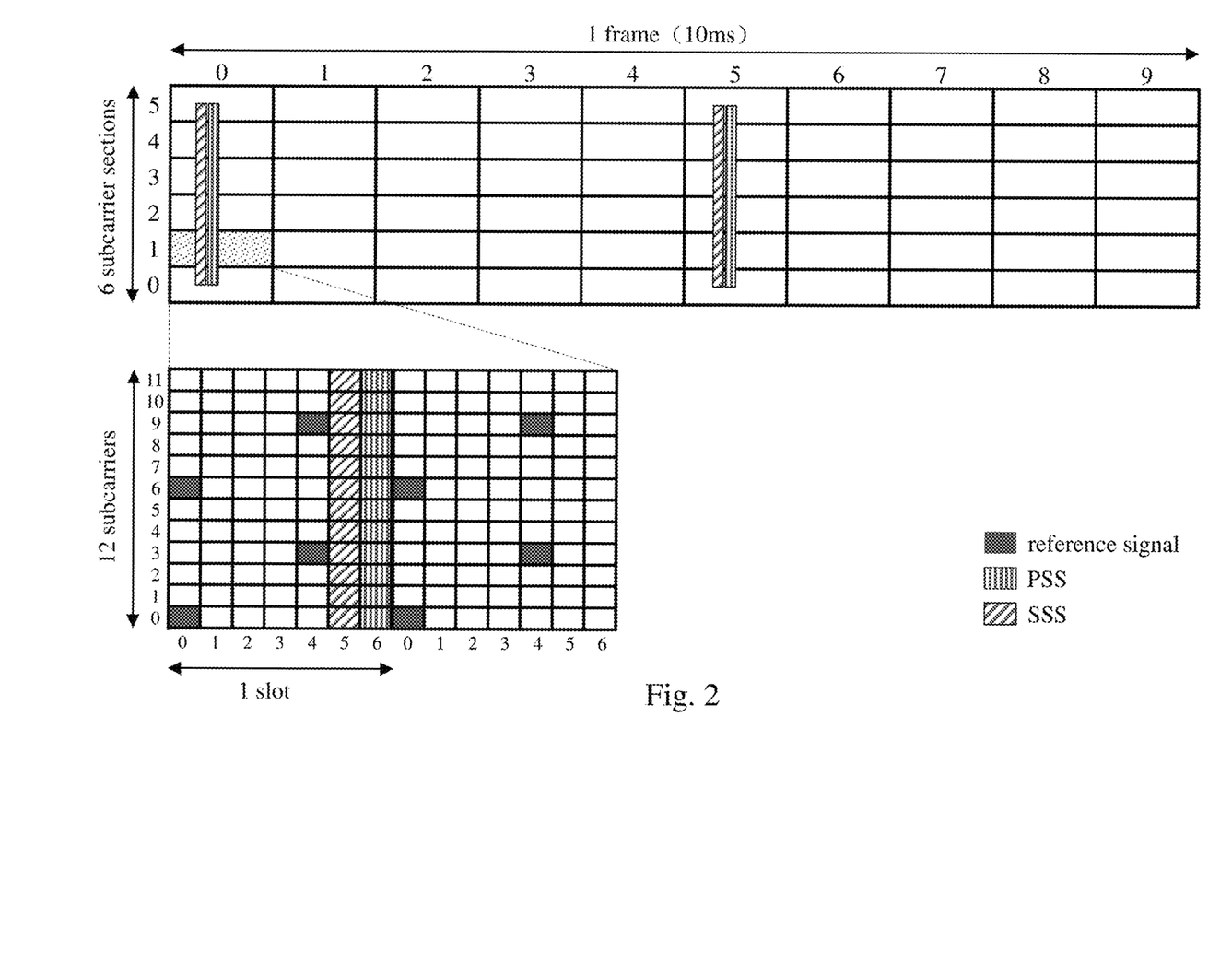
FIG. 2 illustrates the frame structure of the FDD-LTE communication system as well as the distribution of a primary synchronization signal (PSS) and a secondary synchronization signal (SSS).

FIG. 2 illustrates the frame structure of the FDD-LTE communication system as well as the distribution of a primary synchronization signal (PSS) and a secondary synchronization signal (SSS). In FIG. 2, only one frame of a continuous signal is illustrated in the time domain and only 6 sections, each comprising 12 subcarriers, of a plurality of subcarriers are illustrated in the frequency domain. In fact, the signal extends in both the time domain and the frequency domain. The PSS and the SSS are periodic with a period of 5 subframes. As illustrated in the enlarged view of the $1^{st}$ subcarrier section of the $0^{th}$ subframe (the current example corresponding to a normal CP, i.e., one slot comprising 7 OFDM symbols), the PSS and the SSS are respectively located on the $6^{th}$ and $5^{th}$ OFDM symbols of the $1^{st}$ slot. Prior to the PSS and the SSS, a periodic reference signal is presented. For a normal CP, the reference signal appears on the $0^{th}$ and the $4^{th}$ OFDM symbols of one slot; whereas for an extend CP, the reference signal appears on the $0^{th}$ and the $3^{rd}$ OFDM symbols of one slot; that is, in fact the reference signal appears every 3 to 4 OFDM symbols.

Figure 3:
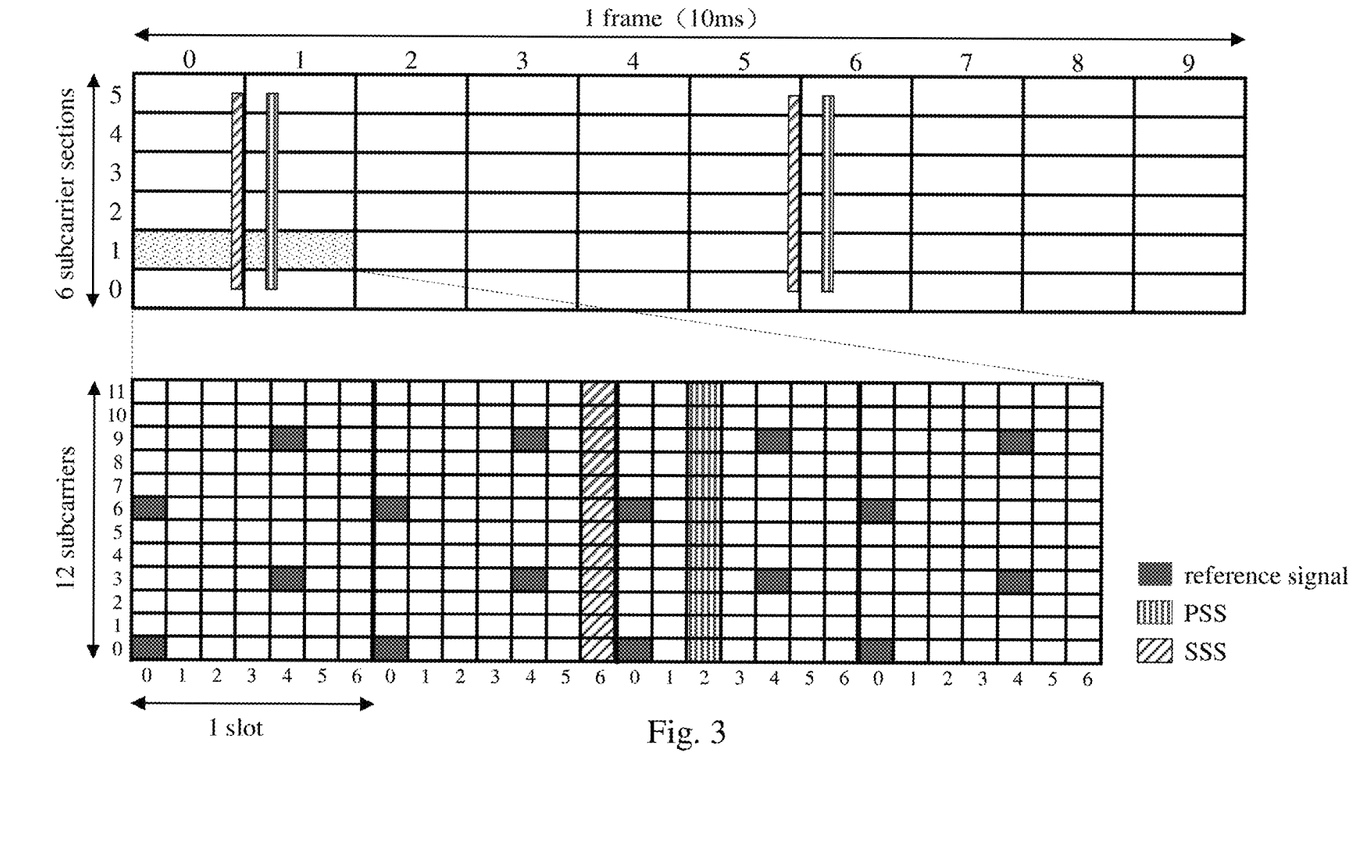
FIG. 3 illustrates the frame structure of the TDD-LTE communication system as well as the distribution of an PSS and an SSS.

Similarly, the PSS, the SSS and the reference signal in the TDD-LTE communication system are also periodic. As shown in FIG. 3, the PSS and the SSS appear every 5 subframes. As illustrated in the enlarged view of the $1^{st}$ subcarrier section of the $0^{th}$ and $1^{st}$ subframes, the PSS and the SSS are separated by 2 OFDM symbols. FIG. 3 also corresponds to normal CPs. Therefore, the reference signal appears on the $0^{th}$ and $4^{th}$ OFDM symbols of one slot; whereas for extend CP, the reference signal appears on the $0^{th}$ and $3^{rd}$ OFDM symbols of one slot.

Based on the aforementioned regularity, a count period T can be set in the UE. In this count period T, the power Ps of the received signal is estimated at the UE. The gain is adjusted according a comparison between the power Ps and a predetermined reference power Pr, and whether the gain should be adjusted again is determined according to a change in the power Ps. In this way, the UE is able to complete the setting of the gain of the signal amplifier before the reception of the PSS and the SSS to ensure the synchronization signals can be correctly received. In addition to the aforementioned PSS, SSS and reference signal, for both the FDD-LTE communication system and the TDD-LTE communication system, the DL channel further includes signals of a physical downlink control channel (PDCCH) and a physical data share channel (PDSCH) in the physical layer. However, because the number of OFDM symbols occupied by the PDCCH signal is not constant and the number of resource blocks in the PDSCH signal can be any value, before performing automatic gain control in the LTE communication system, these uncertainties of the PDCCH signal and the PDSCH signal as well as the dramatic change in the signal power of the received signal caused by switching between the uplink and downlink configurations in the TDD-LTE communication system have to be overcome.

Figure 4:
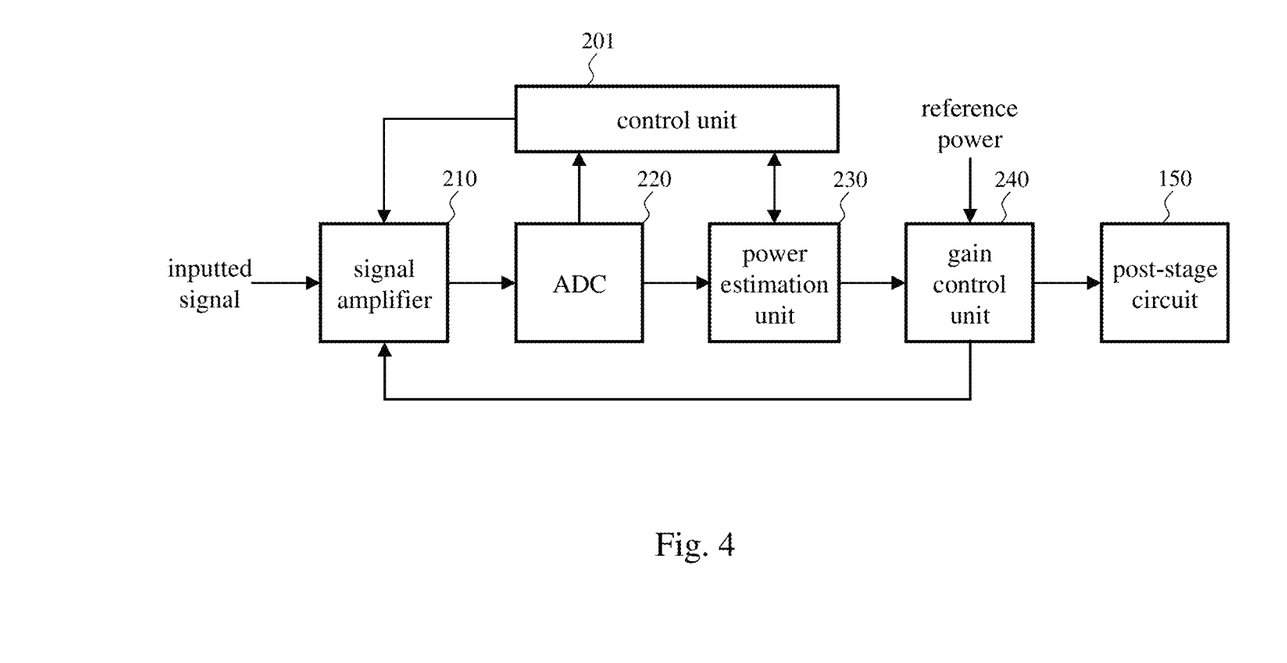
FIG. 4 illustrates a functional block diagram of a signal receiving end of the LTE communication system according to an embodiment of this invention.
Figure 5:
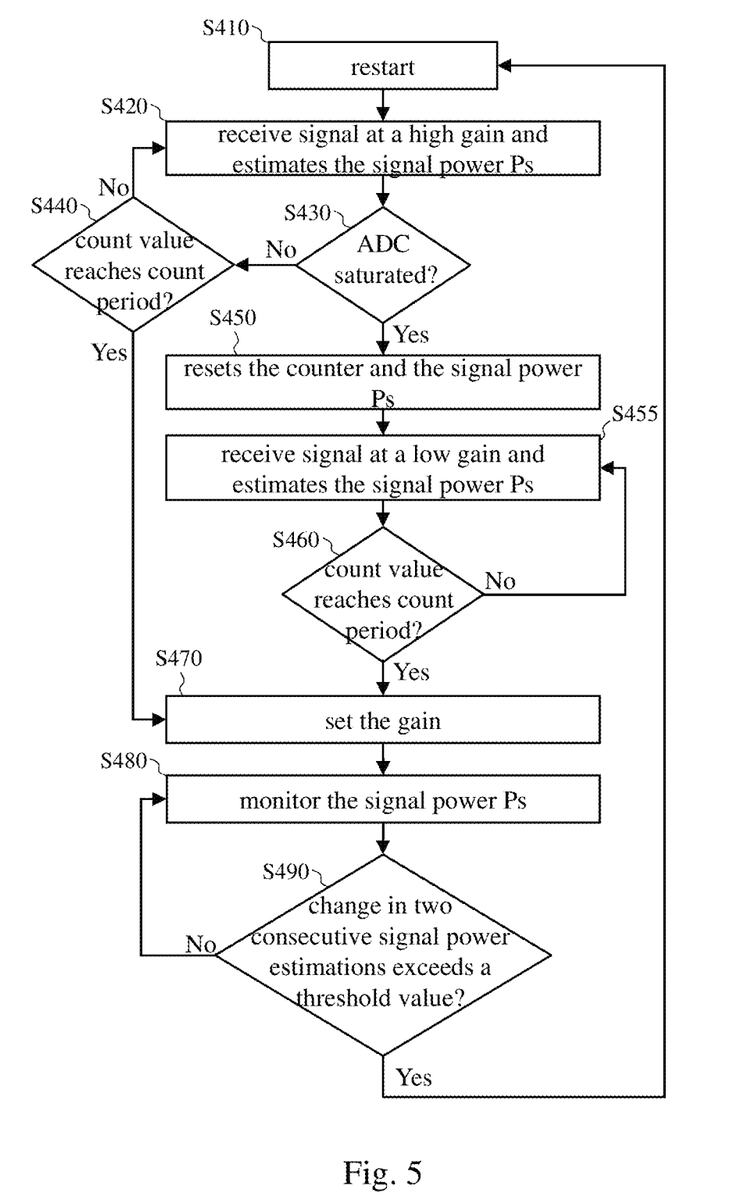
FIG. 5 illustrates a flowchart of automatic gain control corresponding to FIG. 4.

FIG. 4 illustrates a functional block diagram of a signal receiving end of the LTE communication system according to an embodiment of this invention, and FIG. 5 is a flowchart of corresponding automatic gain control. The signal receiving end of the LTE communication system comprises a control unit 201, a signal amplifier 210, an ADC 220, a power estimation unit 230, a gain control unit 240 and a post-stage circuit 150. In the beginning, the entire system is restarted; for example, the control unit 201 erases temporary data and resets counters and the signal power Ps of the power estimation unit 230 (step S410). Then the control unit 201 controls the signal amplifier 210 to receive the inputted signal at a high gain H and causes the counter to start counting, and the power estimation unit 230 estimates the signal power Ps of the inputted signal (step S420). Before the count value C of the counter reaches the count period T, the control unit 201 continuously monitors whether the inputted signal saturates the ADC 220. An occurrence of signal clipping stands for the saturation of the ADC 220 (steps S430 and S440). If these two steps are both negative, the signal amplifier 210 continues receiving the inputted signal at the high gain H and the power estimation unit 230 continues estimating the signal power Ps of the inputted signal (step S420). If in the above steps the ADC does not become saturated and the count value C of the counter reaches the count period T (step S440 being affirmative), the gain control unit 240 sets the gain of the signal amplifier 210 by comparing the detected signal power Ps with the predetermined reference power Pr. As a result, the inputted signal is adjusted by the signal amplifier 210 to a state that is more suitable for the sampling process of the ADC 220 (step S470). However, if the ADC 220 becomes saturated in the above steps (step S430 being affirmative), the control unit 201 immediately switches to a low gain L to receive the inputted signal. More specifically, the control unit 201 immediately resets the counter and the signal power Ps (step S450), controls the signal amplifier 210 to receive the inputted signal at the low gain L, and controls the counter to count from the beginning, and the power estimation unit 230 re-estimates the signal power Ps of the inputted signal (step S455). Similarly, in the count period T, the signal amplifier 210 continues receiving the inputted signal at the low gain L and the power estimation unit 230 continues estimating the signal power Ps of the inputted signal. When the count value C of the counter reaches the count period T (step S460 being affirmative), the gain control unit 240 sets the gain by comparing the detected signal power Ps with the predetermined reference power Pr (step S470). In other words, a "non-close-loop" is employed in the steps S410 to S470 to carry out automatic gain control. The completion of the step S470 means that the adjustment of the gain is completed, so the system is able to receive the inputted signal according to the ideal gain. However, if the power of the inputted signal changes afterwards, for example, switching from the uplink state to the downlink state in the TDD-LTE communication system, or vice versa, the gain needs to be determined again to prevent the old gain from saturating the ADC. Therefore, after the gain is set, the control unit 201 continues monitoring the signal power Ps further based on the calculation of the power estimation unit 230 (step S480). When the change in two consecutive estimations of the signal power Ps exceeds a predetermined threshold (step S490 being affirmative), the control unit 201 carries out the automatic gain control again (back to step S410). In one embodiment, a close-loop mechanism is employed in the step S480 to conduct the automatic gain control.

Figure 6:
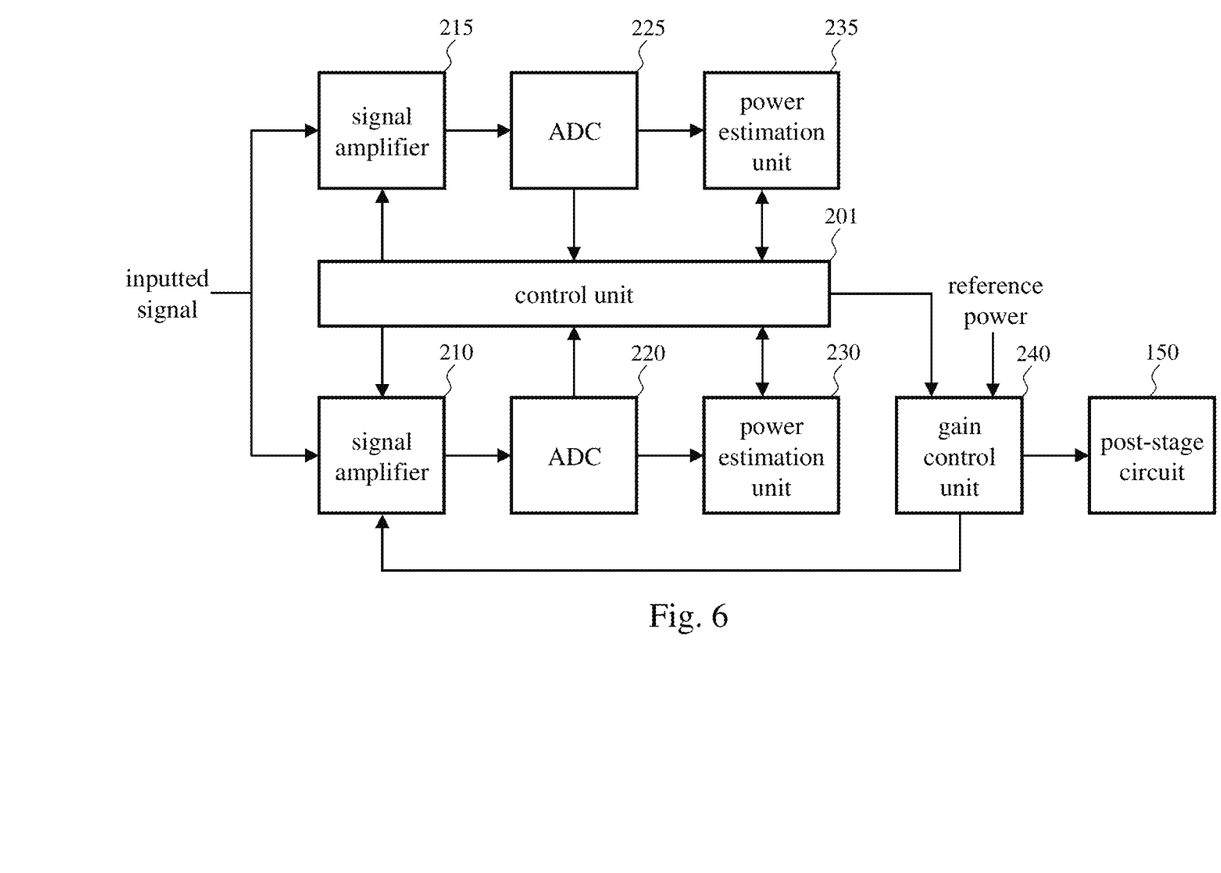
FIG. 6 illustrates another functional block diagram of a signal receiving end of the LTE communication system according to an embodiment of this invention.
Figure 7:
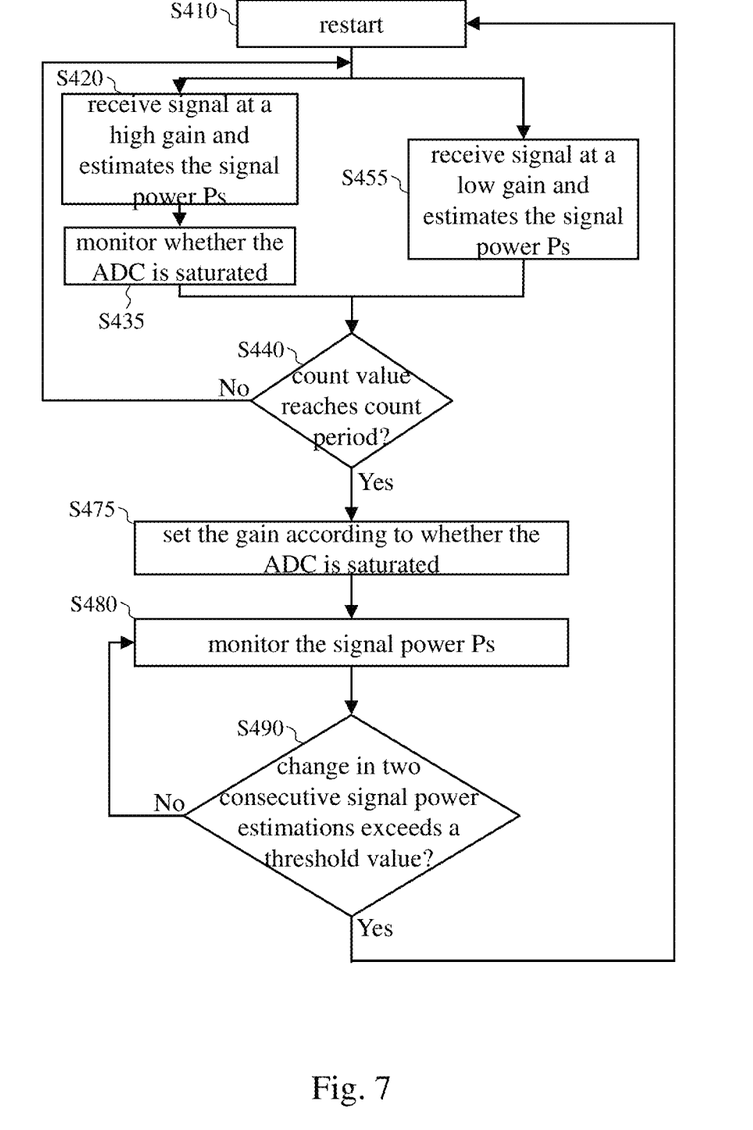
FIG. 7 illustrates a flowchart of automatic gain control corresponding to FIG. 6.

In another embodiment where the UE comprises two sets of receiving circuits, as shown in FIG. 6, the signal receiving end of the LTE communication system of this invention further comprises a signal amplifier 215, an ADC 225 and a power estimation unit 235. Its corresponding flowchart of automatic gain control is shown in FIG. 7. After the system restarts (step S410), the control unit 201 controls the signal amplifiers 210 and 215 to receive the inputted signal at the same time. One of the signal amplifiers 210 and 215 employs the high gain H whereas the other employs the low gain L. And the power estimation units 230 and 235 also start to estimate the signal power Ps (step S420 and S455). In other words, the estimations of signal power for both the high gain mode and the low gain mode can be conducted at the same time. In the following, it is assumed that the signal amplifier 215, the ADC 225 and the power estimation unit 235 are in the high gain mode, whereas the signal amplifier 210, the ADC 220 and the power estimation unit 230 are in the low gain mode. Before the count value reaches the count period (i.e., step S440 being negative), the control unit 201 monitors whether the ADC 225 becomes saturated according to the output of the ADC 225 (step S435). After the estimations of the signal power of both the high gain mode and the low gain mode are complete (step S440 being affirmative), the gain is set according to whether the ADC 225 is saturated (step S475). More specifically, if the ADC 225 is not saturated, in the step S475, the control unit 201 outputs the signal power Ps that the power estimation unit 235 estimates to the gain control unit 240 for determination, or else the control unit 201 outputs the signal power Ps that the power estimation unit 230 estimates to the gain control unit 240. In other words, the "non-close-loop" is employed in steps S410 to S475 to conduct automatic gain control. Likewise, the signal power Ps is continuously monitored in steps S480 and S490. To sum up, when the UE comprises two sets of receiving circuits, the converging process of automatic gain control is accelerated to one-half of the original time required. In one embodiment, a close-loop mechanism is employed in steps S480 and S490.

Setting the high gain H and the low gain L is associated with the characteristics of the ADC and the LTE communication system. In the specification of the LTE communication system, the maximum inputted signal power $P_{max}$ allowed by the UE is −25 dBm, and the minimum inputted signal power $P_{min}$ (a.k.a. lowest sensitivity of the cell search) is defined as received average power of resource elements that carry synchronization signal (SCH_RP), which is −127 dBm. Because the synchronization signal carries 62 subcarriers, the corresponding signal power is $P_{min}$=−127+10×$\log_{10}(62)$=−109 dBm. The full scale level P of the ADC is:

$$P=10\times\log_{10}(1/50)+30=13.01 \text{ dBm} \tag{1}$$

The value 50 represents ADC input impedance, and the value 30 represents a conversion of dB to dBm. Assuming that the effective number of bits of the ADC is B, the quantization noise power of the ADC is:

$$Q=P-(6.02\times B+1.76)\text{dBm} \tag{2}$$

Figure 8:
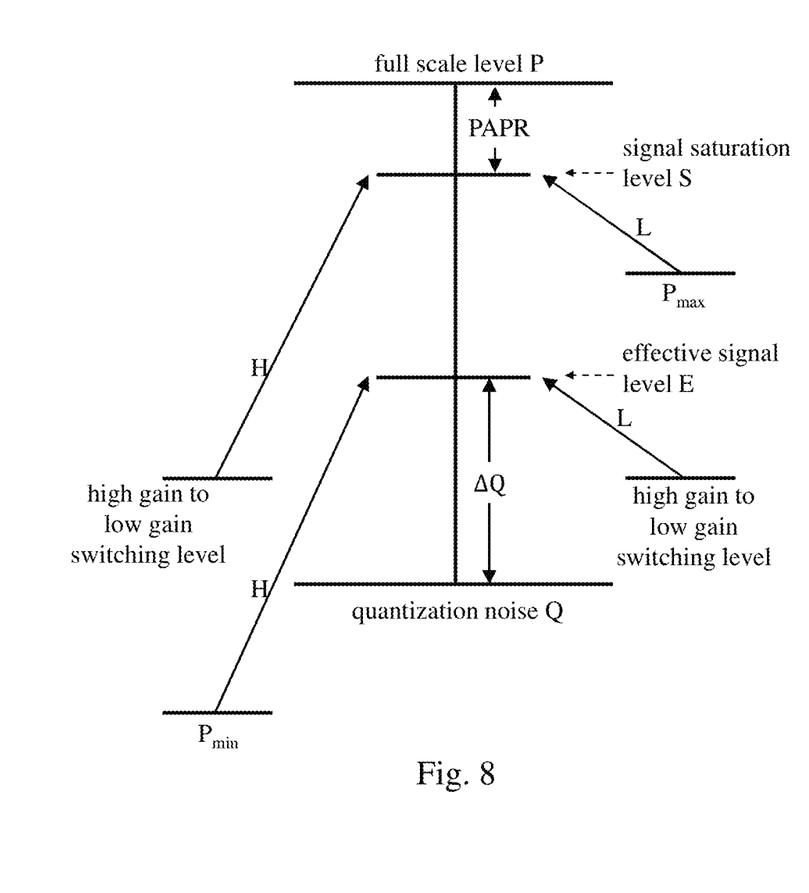
FIG. 8 illustrates a relationship between the high gain H and the low gain L of the automatic gain control and a dynamic range of an ADC.

Referring to FIG. 8 for better understanding how the high gain H and the low gain L are determined in this invention according to the dynamic range of the ADC, the maximum inputted signal power $P_{max}$ and the lowest sensitivity of the cell search $P_{min}$.

1. The key to setting the low gain L is that, the power, after being amplified by the signal amplifier, should not exceed the signal saturation level S when the power of the inputted signal is $P_{max}$. The signal saturation level S represents an allowed value for the ADC not to become saturated during operation, and a difference between the signal saturation level S and the ADC full scale level P should be more than the Peak to Average Power Ratio (PAPR) of the—received signal; that is, the signal saturation level S=P−PAPR. The low gain L can be decided as L=S−$P_{max}$.
2. The key to setting the high gain H is that, the power, after being amplified by the signal amplifier, should fall within a tolerance error of estimating the signal power when the power of the inputted signal is $P_{min}$. Assuming that the tolerance error of estimating the signal power is Δx dB, to avoid the signal power estimation error caused by the quantization noise, the minimum inputted signal, after being amplified by the gain at the frontend, should be higher than the quantization noise power by ΔQ.

$$\Delta Q = 10 \times \log_{10}\left(\frac{1}{10^{\Delta x/10} - 1}\right) dB \qquad (3)$$

That is, the effective signal level E=Q+ΔQ. As a result, the lower limit of the high gain H can be determined to be H≥E-P$_{min}$. Meanwhile, to ensure that the requirement of the tolerance error Δx is still met at a switching point from high gain to low gain, i.e., switching immediately from high gain to low gain as the received signal saturates the ADC in a high gain mode, the high gain H must satisfy S-H+L≥E. To sum up, the high gain H should be within the range: E-P$_{min}$≤H≤S-E+L.

3. To obtain a stable estimation of the received power, an appropriate count period T must be selected. As shown in FIGS. 2 and 3, for whether the FDD-LTE communication system or the TDD-LTE communication system, each subframe comprises a total number of 4 OFDM symbols for transmitting the reference signal, which are respectively on the $0^{th}$, $4^{th}$, $7^{th}$ and $11^{th}$ OFDM symbols for a normal CP and on the $0^{th}$, $3^{rd}$, $6^{th}$ and $9^{th}$ OFDM symbols for an extend CP. The counting interval of the counter should cover at least one reference symbol to avoid a serious error in the estimation of the received power when the resource block does not transmit data. In other words, the count period T should be equal to or greater than 4 OFDM symbols for a normal CP and be equal to or greater than 3 OFDM symbols for an extend CP. According to the flow of FIG. 4, the gain can be determined in at most 2 count periods (2T). To be specific, for the TDD-LTE communication system (as shown in FIG. 3), there are 13 OFDM symbols, which cover more than three count periods (3T), from the beginning of a frame to the arriving of the synchronization signals, so the system is ensured to become stable within these 3 gain adjusting opportunities. Alternatively, according to the flow of FIG. 5 where the UE comprises 2 sets of receiving circuits, ideally the gain can be determined within one count period T;

4. In normal counting, the count value C of the counter can be expressed as: C=mod(C+1, T);

5. To determine the reference power Pr, the transmission density of the resource blocks in one subframe has to be taken into account. In light of a situation where in one count period T there are only reference signals while the resource blocks do not transmit data at all, a margin should be saved for the reference power Pr to avoid saturation. As a result, the reference power Pr can be expressed as:

$$P_r = S - 10 \cdot \log_{10}\left(\frac{N_{sym} \cdot 12 \cdot N_{RB}}{2N_{RB}}\right) \qquad (4)$$
$$= S - 10 \cdot \log_{10}(6 \cdot N_{sym})$$

where N$_{sym}$ is the number of OFDM symbols in one count period T, N$_{RB}$ is the number of resource blocks in one subframe, 12 represents the number of subcarriers in one resource block, and 2 represents the number of subcarriers occupied by the reference signal in one resource block;

6. The estimation of the signal power Ps can be the Received Signal Strength Indicator (RSSI) provided by the radio frequency circuit, which can be represented at a digital terminal as:

$$P_s(n) = \frac{1}{T}\sum_{t=0}^{T-1} |x(nT+t)|^2 \qquad (5)$$

where x(t) is a digital inputted signal and T is the count period.

Taking an ADC having an effective number of 12 bits as an example, the high gain H and the low gain L can be obtained by the following steps:

1. defining a dynamic range of the ADC with P=13.01 dBm and Q=−60.99 dBm;
2. setting PAPR to be 12 dB, then S=13.01−12=1.01 dBm, and L=13−12−(−25)=26 dB;
3. setting the tolerance of the signal power to be 1 dB, ΔQ=5.86 dB, E=−60.99+5.86=−55.13 dBm, then the range of H being 53.87≤H≤82.14 and setting H=60 dB;
4. calculating the switching point from high gain to low gain: 13.01−12−60=−58.99 dBm.

Since people of ordinary skill in the art can appreciate the implementation detail and the modification thereto of the present method invention of FIG. 5 and FIG. 7 through the disclosure of the device invention of FIGS. 4 and 6, repeated and redundant description is thus omitted. Please note that there is no step sequence limitation for the method inventions as long as the execution of each step is applicable. Furthermore, the shape, size, and ratio of any element and the step sequence of any flow chart in the disclosed figures are exemplary for understanding, not for limiting the scope of this invention.

The aforementioned descriptions represent merely the preferred embodiments of the present invention, without any intention to limit the scope of the present invention thereto. Various equivalent changes, alterations, or modifications based on the claims of the present invention are all consequently viewed as being embraced by the scope of the present invention.

What is claimed is:

1. An auto gain control method of a communication receiving end, the communication receiving end comprising an analog-to-digital converter (ADC), the method comprising:
    adjusting an inputted signal according to a first predetermined gain;
    determining whether said adjusted inputted signal saturates said ADC; and
    adjusting said inputted signal according to a second predetermined gain;
    wherein, said first predetermined gain is associated with a first inputted signal power processed by said communication receiving end and a quantization noise of said ADC, said second predetermined gain is associated with a second inputted signal power processed by said communication receiving end and a full scale level of said ADC, and said first inputted signal power is smaller than said second inputted signal power.

2. The auto gain control method of claim 1, further comprising:
    estimating said adjusted inputted signal in a predetermined time to generate an estimated signal power;
    wherein, one of a plurality of orthogonal frequency division multiplexing (OFDM) symbols of said inputted signal comprises a reference signal in said predetermined time.

3. The auto gain control method of claim 2, wherein the step of determining whether said adjusted inputted signal saturates said ADC is carried out in said predetermined time.

4. The auto gain control method of claim 2, further comprising:
generating, according to the estimated signal power and a reference power, a gain based on which said communication receiving end adjusts the inputted signal;
wherein, said reference power is associated with the number of subcarriers occupied by said reference signal in a subcarrier section of said inputted signal.

5. The auto gain control method of claim 2, wherein said inputted signal comprises a normal cyclic prefix of a Long-Term Evolution (LTE) communication system, and said predetermined time is equal to or greater than an equivalent time of four OFDM symbols.

6. The auto gain control method of claim 2, wherein said inputted signal comprises an extend cyclic prefix of an LTE communication system, and said predetermined time is equal to or greater than an equivalent time of three OFDM symbols.

7. The auto gain control method of claim 1, wherein the step of adjusting said inputted signal according to said second predetermined gain is carried out after said adjusted inputted signal saturating said ADC is determined in said determination step.

8. The auto gain control method of claim 1, wherein the communication receiving end comprises a first receiving circuit and a second receiving circuit, the step of adjusting said inputted signal according to said first predetermined gain and the step of adjusting said inputted signal according to said second predetermined gain are respectively carried out by said first receiving circuit and said second receiving circuit at substantially the same time.

9. A communication receiving end, for receiving an inputted signal, comprising:
a first signal amplifier, for adjusting said inputted signal according to a first predetermined gain or a second predetermined gain to generate a first adjusted signal;
a first ADC, coupled to said first signal amplifier, for performing analog-to-digital conversion on said first adjusted signal; and
a control unit, coupled to said first ADC, for determining whether said first ADC becomes saturated according to an output of said first ADC;
wherein, said first predetermined gain is associated with a first inputted signal power processed by said communication receiving end and a quantization noise of said first ADC, said second predetermined gain is associated with a second inputted signal power processed by said communication receiving end and a full scale level of said first ADC, and said first inputted signal power is smaller than said second inputted signal power.

10. The communication receiving end of claim 9, further comprising:
an estimation unit, coupled to said first ADC, for estimating a power of said first adjusted signal in a predetermined time to generate an estimated signal power;
wherein, one of a plurality of OFDM symbols of said inputted signal comprises a reference signal in said predetermined time.

11. The communication receiving end of claim 10, wherein said control unit determines in said predetermined time whether said first adjusted signal saturates said first ADC.

12. The communication receiving end of claim 10, further comprising:
a gain control unit, coupled to said first signal amplifier, for generating a gain according to said estimated signal power and a reference power, wherein said first signal amplifier adjusts said inputted signal based on said gain;
wherein, said reference power is associated with the number of subcarriers occupied by said reference signal in a subcarrier section of said inputted signal.

13. The communication receiving end of claim 12, further comprising:
a second signal amplifier, for adjusting said inputted signal according to said first predetermined gain or said second predetermined gain to generate a second adjusted signal, wherein, said first signal amplifier and said second signal amplifier adjust said inputted signal at substantially the same time based on different predetermined gains;
a second ADC, coupled to said second signal amplifier and said control unit, for performing analog-to-digital conversion on said second adjusting signal;
wherein, said control unit utilizes an output of one of said first ADC and said second ADC as a basis according to which said gain control unit generates said gain.

14. The communication receiving end of claim 10, wherein said inputted signal comprises a normal cyclic prefix of an LTE communication system, and said predetermined time is equal to or greater than an equivalent time of four OFDM symbols.

15. The communication receiving end of claim 10, wherein said inputted signal comprises an extend cyclic prefix of an LTE communication system, and said predetermined time is equal to or greater than an equivalent time of three OFDM symbols.

16. A gain control method, applied to a gain control circuit of a communication receiving end, said gain control method comprising:
in a first phase, utilizing a non-close-loop mechanism to perform gain control on said gain control circuit; and
in a second phase subsequent to said first phase, utilizing a close-loop mechanism to perform gain control on said gain control circuit;
wherein, said communication receiving end comprises an ADC, and the non-close-loop mechanism comprises:
selecting one of a first predetermined gain and a second predetermined gain to perform gain control on said gain control circuit according to whether the ADC becomes saturated;
wherein, said first predetermined gain is associated with a first inputted signal power processed by said communication receiving end and a quantization noise of the ADC, said second predetermined gain is associated with a second inputted signal power processed by said communication receiving end and a full scale level of said ADC, and said first inputted signal power is smaller than the second inputted signal power.

17. The gain control method of claim 16, further comprising:
utilizing one of said first predetermined gain and said second predetermined gain to adjust an inputted signal;
estimating said adjusted inputted signal in a predetermined time to generate an estimated signal power;
wherein, in said predetermined time, one of a plurality of OFDM symbols of said inputted signal comprises a reference signal.

18. The gain control method of claim 17, further comprising:
   determining whether said adjusted inputted signal saturates said ADC in said predetermined time.

19. The gain control method of claim 17, further comprising:
   generating, according to said estimated signal power and a reference power, a gain based on which said communication receiving end adjusts said inputted signal;
   wherein, said reference power is associated with the number of subcarriers occupied by said reference signal in a subcarrier section of said inputted signal.

\* \* \* \* \*